United States Patent

Metzger

[15] 3,705,335

[45] Dec. 5, 1972

[54] LOW HEIGHT CERAMIC CAPACITOR FOR PRINTED CIRCUIT BOARD MOUNTING

[72] Inventor: Louis G. Metzger, Closter, N.J.

[73] Assignee: JFD Electronics Corp., Brooklyn, N.Y.

[22] Filed: Aug. 19, 1971

[21] Appl. No.: 173,117

[52] U.S. Cl. ..........................317/249 D, 317/101 C

[51] Int. Cl. ..........................................H01g 5/06

[58] Field of Search..........317/249 R, 249 D, 101 C, 101 CC, 317/101 CM, 101 CP; 29/626; 174/119 R

[56] References Cited

UNITED STATES PATENTS

| | | | |
|---|---|---|---|
| 3,296,099 | 1/1967 | Dinella | 29/626 |
| 3,302,067 | 1/1967 | Jackson | 317/101 CM |
| 3,371,249 | 2/1968 | Prohofsky | 317/101 CM |
| 3,444,436 | 5/1969 | Coda | 317/101 CC |
| 3,471,753 | 10/1969 | Burks | 317/101 CP |
| 3,500,147 | 3/1970 | Hirschberg | 317/249 R |
| 3,558,803 | 1/1971 | Osborn | 174/119 R |
| 3,244,951 | 4/1966 | Wallace | 317/249 D |

*Primary Examiner*—E. A. Goldberg
*Attorney*—Sidney G. Farber et al.

[57] ABSTRACT

A trimmer capacitor having painted conductive leads is soldered directly to appropriate conductive sections of a printed circuit panel. A portion of the adjustment mechanism of the printed circuit board is disposed at least partly within an opening in the printed circuit board so that the capacitor height above the surface of the board is reduced by the thickness of the board. In one disclosed embodiment, the rotor electrode is electrically connected to an electrode on the bottom of the stator body, which electrode is soldered to the printed circuit board. The rotor body has a diameter smaller than that of the stator body and is enclosed by a tubular soldering shield while the capacitor is being connected to the printed circuit board.

15 Claims, 6 Drawing Figures

PATENTED DEC 5 1972

3,705,335

SHEET 1 OF 2

INVENTOR.
LOUIS G. METGER

BY

Ostrolenk, Faber, Gerb & Soffen
ATTORNEYS

INVENTOR.
LOUIS G. METZGER
BY
Ostrolenk, Faber, Gerb & Soffen
ATTORNEYS

LOW HEIGHT CERAMIC CAPACITOR FOR PRINTED CIRCUIT BOARD MOUNTING

BACKGROUND OF THE INVENTION

This invention relates to miniature trimmer capacitors, and more specifically relates to a novel structure and method of assembly for a trimmer capacitor which is mounted on a printed circuit board.

Miniature trimmer capacitors are well known, and provide a given range of capacitance adjustment with a relatively small volume device. One such trimmer capacitor, which can be modified in accordance with the present invention, is the trimmer capacitor shown in U. S. Pat. No. 3,244,951 to Wallace, entitled LAMINATED ROTOR STRUCTURE FOR VARIABLE CAPACITORS, and assigned to the assignee of the present invention. The device shown in the above-noted patent is a complete capacitor device which is provided with extending leads connected to the rotor and stator electrodes, respectively, which enable the connection of the device in a particular circuit. Thus, if the device of the above-noted patent were to be used in connection with a printed circuit board arrangement, the entire device would be mounted on top of the printed circuit board, and its extending leads would be soldered into the printed circuit board configuration in the usual manner.

Many applications of trimmer capacitors have low height restrictions above the printed circuit board, and require ease of assembly, such that the capacitor leads can be soldered directly to the printed circuit board. The present invention provides a novel improved trimmer capacitor design which has very low height, which can be soldered directly to a printed circuit panel, and which is adapted such that the sliding interface between the rotor and stator bodies can be easily shielded during the soldering operation.

BRIEF DESCRIPTION OF THE INVENTION

In accordance with the present invention, a trimmer capacitor construction for a printed circuit is provided, wherein a portion of the mechanism which fixes the trimmer capacitor together is carried in an opening in the printed circuit panel. By following this type novel construction, the total height of the trimmer capacitor may be reduced by the thickness of the printed circuit panel board, which typically could be from one-sixteenth to one thirty-second of an inch, which is a size comparable to about half the height of a trimmer capacitor which can be used in any electronic wrist watch application. The height of said device is further reduced by the absence of a stator lead, which allows a still further reduction in height of the stator body.

As a further feature of the invention, the trimmer capacitor is adapted for use particularly with a printed circuit board, and accordingly is provided with only painted-on leads, as contrasted to conventional extending leads, where these painted-on leads are electrically connected by soldering to the appropriate conductive areas of a printed circuit panel. Moreover, the capacitor is assembled in such a manner that the sliding junction between the opposed surfaces of the rotor and the stator of the capacitor is not exposed to soldering fluxes or fumes created during the soldering of the stator to the panel and of the rotor connection to the panel.

More specifically, in one embodiment of the invention, the bottom surface of the stator is provided with a conductive coating which has a tab extending to the outer edge of the stator body. This coating is connected, through the capacitor assembly mechanism, to the rotor electrode. This bottom stator electrode may then be connected to the printed circuit board by soldering, thereby to allow connection of the rotor to the printed circuit board by a solder connection. The main stator electrode, which faces the rotor electrode, is also provided with an extending section which may be soldered to an appropriate conductor on the printed circuit board.

DETAILED DESCRIPTION OF THE DRAWINGS

Figure 1:
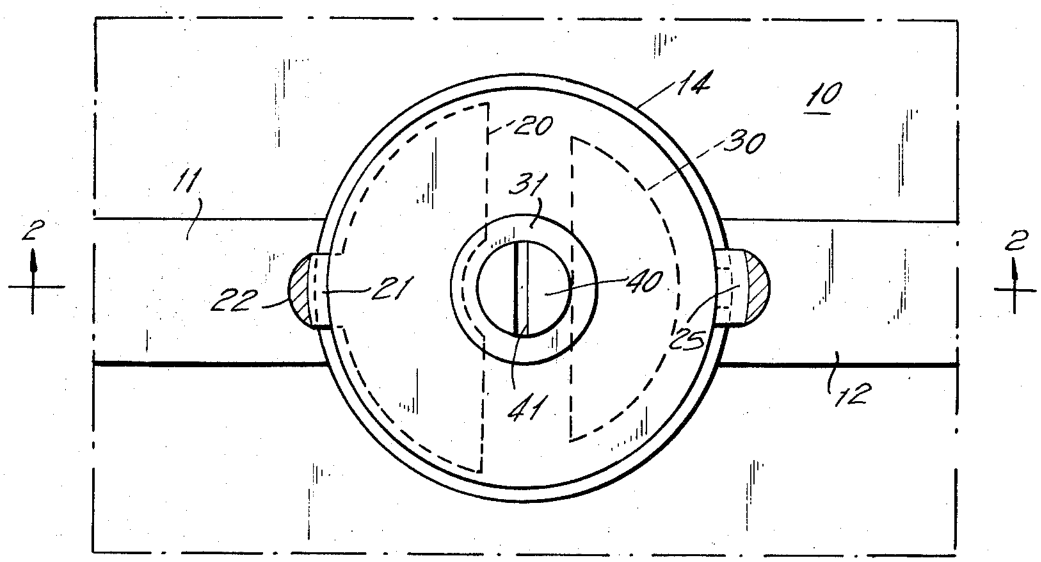
FIG. 1 is a top plan view of a capacitor built in accordance with the present invention.

Referring first to FIGS. 1 to 5, there is shown a portion of a printed circuit board 10 which has a conductive pattern 11, to be connected to one electrode of a trimmer capacitor and a conductive pattern 12 to be connected to the other electrode of a trimmer capacitor. A trimmer capacitor is then provided which consists of a stator 13 of suitable dielectric material, a rotor 14, and a securement mechanism 15 which holds the stator 13 and rotor 14 assembled. It is to be noted that the dimensions of these bodies have been exaggerated for purposes of clarity.

Figures 3, 4:
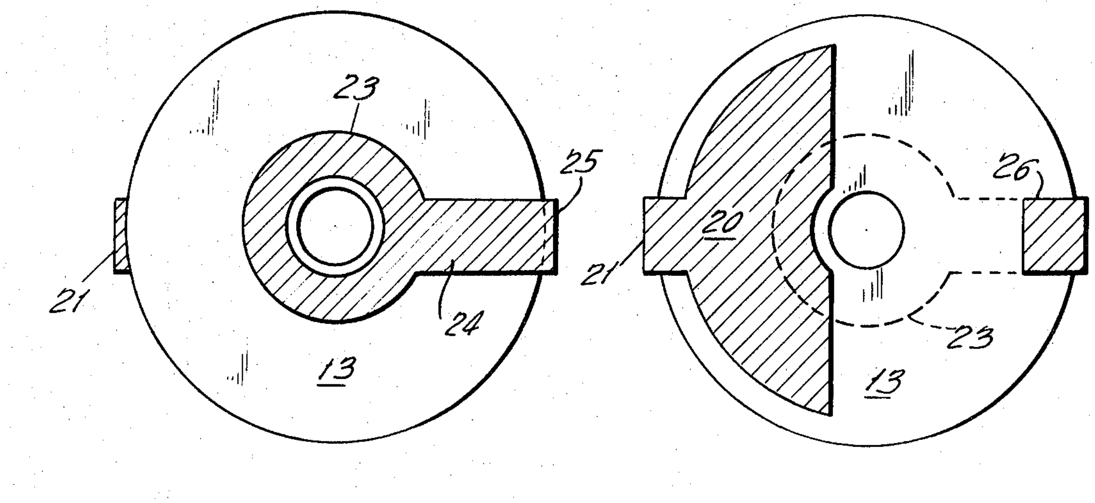
FIG. 3 is a bottom plan view of the stator of FIGS. 1 and 2.
FIG. 4 is a top plan view of the stator of FIG. 2.

Stator 13, best shown in FIGS. 1, 3 and 4 has a semicircular conductive electrode 20 thereon. NOte that a small tab 21 extends down one edge of stator 13, which tab permits soldering of stator electrode 20 to conductive layer 11 by solder mass 22. The opposite and bottom surface of stator 13 further is provided with a ring-shaped conductive coating 23 which has an extending tab 24 extending to the edge of the stator 13. Tab 24 is connected to a conductive region 25 which extends over the edge of stator 13 and is connected to a conductive pad 26 disposed atop stator 13.

Both pad 26 and stator electrode 20 are polished to form a flat surface for receiving the bottom of rotor 14. Rotor 14 is constructed in a manner substantially identical to that of the aforementioned U.S. Pat. No. 3,244,951, and contains an electrode 30 embedded in a dielectric body. A conductive ring 31, disposed on top of rotor 14, is connected to electrode 30 by the central metalizing 32 in the interior of the opening formed in rotor 14.

Rotor 14 is then rotatably held with respect to stator 13 and printed circuit board 10 by mechanism 15 which includes a conductive adjustment shaft 40 which is soldered to metalizing 30 of rotor 14 so that the two form a subassembled unit. Shaft 40 has a tool-receiving slot 41. The bottom of shaft 40 receives a conductive washer 42, a conductive bowed spring washer 43 and a conductive flat low-friction washer 44. The lower end of shaft 40 is then staked outwardly to curl into contact with washer 44 to compress washer 43 and press washer 42 into contact with conductive layer 23. Thus, the rotor electrode 30 is connected to layer 12 of the printed circuit board through shaft 40, and washers 44, 43 and 42. It will be clear that other securing mechanisms could be used. Note that this rotor connection is made to the same surface of board 10 as receives the stator electrode 20. Moreover, the overall height of the unit above the board 10 is further reduced since a portion of the shaft 40 and mechanism 15 is disposed within the thickness of board 10.

Obviously, the capacitance between conductors 11 and 12 may be adjusted by rotating rotor 14, thereby to cause more or less overlap of electrodes 20 and 30, shown in their minimum capacitance adjustment position. Obviously, any desired pattern could have been used for the rotor and stator electrodes. It will be further noted that the relative positions of rotor and stator could be reversed, with the capacitor element adjacent to board 10 having the embedded electrode.

An important feature of the invention lies in its ease of assembly and the reliability of the assembled device. Thus, all parts may be assembled in separate subassemblies and tabs 21 and 25 are then soldered to conductive regions 11 and 12, respectively. The rotor 14 may then be assembled on the stator 13, after all soldering flux has been suitably cleaned from the upper stator surface. Thus, the opposing surfaces of the rotor and stator are clean and unpitted.

Figure 2:
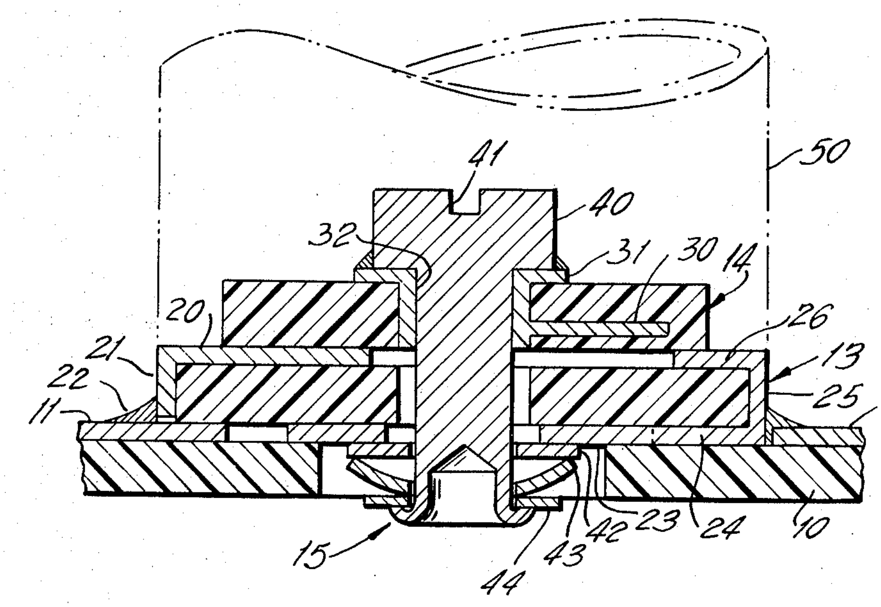
FIG. 2 is a cross-sectional view of FIG. 1 taken across section lines 2 — 2 in FIG. 1.

To enhance this operation, the stator 13 may have a larger diameter than the rotor 14, and the trimmer capacitor may be mechanically assembled on the board 10. Thereafter, a hollow tubular shield, shown in dotted lines 50 in FIG. 2, is placed over the rotor 14 and encloses the interface between rotor 14 and stator 13. Thereafter, tabs 21 and 25 may be soldered to regions 11 and 12, respectively, and the flux removed thereafter without contaminating this interface, which is shielded during this operation.

Figure 5:
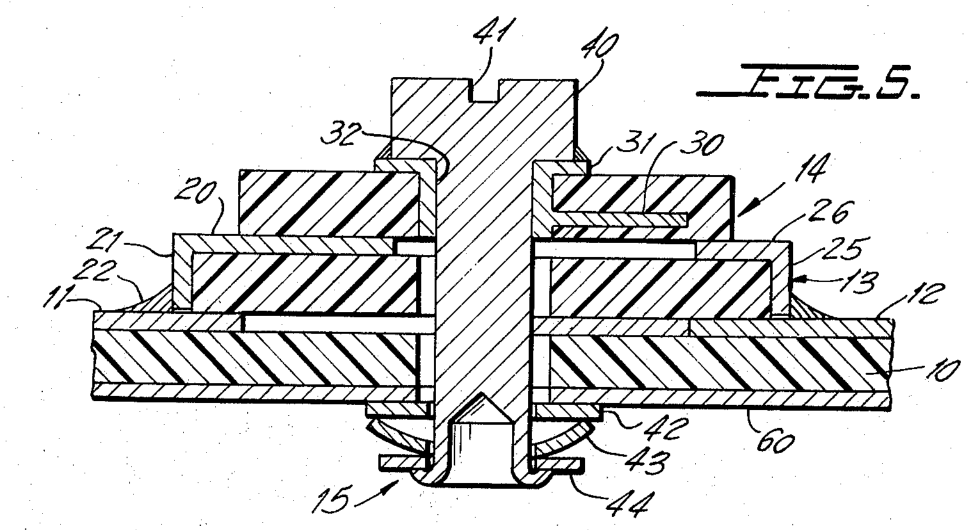
FIG. 5 is a cross-sectional view, similar to FIG. 2, of a second embodiment of the invention.

FIG. 5 shows a further embodiment of the invention wherein conductive regions are provided on both surfaces of board 10. Thus, in FIG. 5, a conductive region 60 is provided on the rear surface of board 10 and is contacted by washer 42 to connect rotor electrode 30 to region 60. Note that pad 26 is retained to help rotatably support rotor 14, and that tab 25 is still provided to assist in securing stator 13 to board 10.

Figure 6:
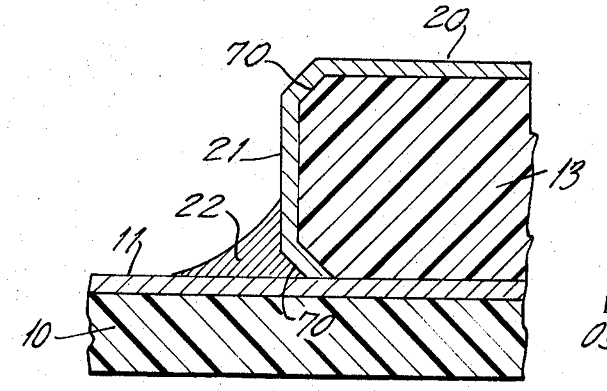
FIG. 6 is an enlarged cross-sectional view of a portion of the stator of the foregoing figures to illustrate the use of a chamfered corner to improve the formation of the conductive coating.

FIG. 6 illustrates an embodiment of the invention wherein the sharp edges of the dielectric wafers defining the rotor and stator bodies (and illustrating the stator 13 in FIG. 6) may be chamfered to improve their ability to receive conductive coatings which extend around their edge. Thus, in FIG. 6, stator 13 is shown as having a chamfered edge 70 where the tab 21 continues from stator electrode 20. The use of this chamfer has been found to prevent the possible separation of the conductive coating at the edge. In addition, and as shown in FIG. 6, the bottom edge 70 of stator 13 is chamfered. It was found that this chamfer assists in the formation of the solder fillet 22.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

The embodiments of the invention in which an exclusive privilege or property is claimed are defined as follows:

1. In combination, a flat panel of insulation material, and a trimmer capacitor;

said panel having a conductive region on one surface thereof; said panel having an opening therethrough;

said trimmer capacitor comprising a stator body, a rotor body, an adjustment shaft connected to said rotor body and rotatable therewith and securement means for securing one end of said shaft relative to said stator body, whereby said rotor and stator bodies engage one another over an interface and are rotatable relative to one another;

said stator body comprising a flat body of dielectric material having an elongated stator electrode secured thereto and coplanar therewith; said stator body having an opening therethrough in alignment with said opening in said panel; one surface of said stator body which is opposite the surface engaged by said rotor body being secured to said one surface of said panel; and solder means for soldering said elongated electrode of said stator body to said conductive region;

said rotor body comprising a flat body of dielectric material disposed in a plane parallel to the plane of said stator body; an elongated rotor electrode supported by said rotor body and disposed in a plane parallel to the plane of said rotor body, and defining a variable capacitance with said stator electrode, depending on their relative angular positions; said rotor body having an opening therethrough aligned with said opening in said panel;

said adjustment shaft extending through said opening in said rotor body, and through said opening in said stator body, and through said opening in said panel;

said securement means connected to the end of said adjustment shaft adjacent said panel and being at least partly disposed within said opening in said panel; said securement means mechanically securing said adjustment shaft relative to said panel;

said adjustment shaft being electrically connected to said rotor electrode; and electrical connection means connected to said adjustment shaft for forming an electrical connection to said rotor electrode.

2. The combination of claim 1 wherein said securement means defines a mechanical connection from said adjustment shaft to a portion of the surface of said stator body which is adjacent said panel; said stator body being mechanically secured to said panel, at least in part, by the said solder means whereby said rotor body and said adjustment shaft are secured to said panel.

3. The combination of claim 1 wherein said stator body includes a conductive coating on the surface thereof adjacent said panel, which conductive coating extends to the outer periphery of said stator body, and further including a second conductive region on said one surface of said panel, and means electrically connecting said adjustment shaft to said conductive coating on said stator body; and a second solder means for soldering said conductive coating, and thus said stator body, to said second conductive region.

4. The combination of claim 3 wherein said securement means defines a mechanical connection from said adjustment shaft to a portion of the surface of said stator body which is adjacent said panel; said stator body being mechanically secured to said panel, at least in part, by the said solder means whereby said rotor body and said adjustment shaft are secured to said panel.

5. The combination of claim 1 wherein said rotor body has a diameter smaller than the diameter of said stator body to expose an annular ring about the top surface of said stator body; said annular ring being adapted to receive a hollow tubular soldering shield during soldering.

6. The combination of claim 3 wherein said rotor body has a diameter smaller than the diameter of said stator body to expose an annular ring about the top surface of said stator body; said annular ring being adapted to receive a hollow tubular soldering shield during soldering.

7. The combination of claim 1 wherein said securement means includes a bowed washer pressed between first and second flat washers; said first washer mechanically bearing against said stator body; said second washer mechanically connected to said end of said adjustment shaft.

8. The combination of claim 1 wherein said securement means includes a bowed washer pressed between first and second flat washers; said first washer mechanically bearing against said panel; said second washer mechanically connected to said end of said adjustment shaft.

9. The combination of claim 1 wherein at least one of said stator electrode or said rotor electrode is embedded in their respective dielectric body.

10. The combination of claim 1 wherein said stator electrode has an extension thereon extending along the outer periphery of said stator body; said solder means connected to said extension.

11. The combination of claim 3 wherein said stator electrode has an extension thereon extending along the outer periphery of said stator body; said solder means connected to said extension, and wherein said second conductive region has an extension thereon extending along the outer periphery of said stator body at a region spaced from said extension from said stator electrode; said second solder means connected to said extension of said second conductive region.

12. The combination of claim 11 wherein said stator electrode extends over a portion of the surface of said stator body which faces said rotor body; said extension of said second conductive region comprising a conductive pad section disposed on said last-mentioned surface and spaced from said stator electrode and defining, with said stator electrode, a continuous surface for slidably receiving said rotor body.

13. A trimmer capacitor adapted for solder-mounting on a printed circuit board; said trimmer capacitor comprising a stator body having a stator electrode and a rotor body having a rotor electrode; said stator body and said rotor body each comprising thin dielectric wafers having respective first and second parallel surfaces; adjustment shaft means connected to said rotor body and holding said first parallel surface of each of said stator body and said rotor body respectively adjacent one another with said rotor body being rotatable relative to said stator body; said stator body having first and second spaced conductive regions at its outer periphery; said first conductive region of said stator body being electrically connected to said stator electrode; said second conductive region of said stator body being electrically connected to said rotor electrode; said first and second conductive regions being solderable for mechanically connecting said first and second conductive regions of said stator body to respective first and second conductive regions of a printed circuit board for mechanically connecting said trimmer capacitor to a printed circuit board.

14. The combination of claim 13 wherein said rotor body has a diameter smaller than the diameter of said stator body to expose an annular ring about the top surface of said stator body; said annular ring being adapted to receive a hollow tubular soldering shield during soldering.

15. A trimmer capacitor adapted for solder-mounting on a printed circuit board; said trimmer capacitor comprising a stator body having a stator electrode and a rotor body having a rotor electrode; said stator body and said rotor body each comprising thin dielectric wafers having respective first and second parallel surfaces; adjustment shaft means connected to said rotor body and holding said first parallel surface of each of said stator body and rotor body respectively adjacent one another with said rotor body being rotatable relative to said stator body; said stator body having first and second spaced conductive regions at its outer periphery; said first conductive region of said stator body being electrically connected to said stator electrode; said second conductive region of said stator body being electrically connected to said rotor electrode; said first and second conductive regions being solderable for mechanically connecting said first and second conductive regions of said stator body to respective first and second conductive regions of a printed circuit board for mechanically connecting said trimmer capacitor to a printed circuit board; said stator electrode being formed on said first surface of said stator body; said stator body having a conductive mounting electrode formed on its said second surface; said conductive mounting electrode being connected to said second conductive region.

* * * * *